United States Patent
Hall et al.

(10) Patent No.: US 9,702,925 B2
(45) Date of Patent: Jul. 11, 2017

(54) SEMICONDUCTOR DEVICE WITH UPSET EVENT DETECTION AND METHOD OF MAKING

(71) Applicants: Mark D. Hall, Austin, TX (US); Mehul D. Shroff, Austin, TX (US)

(72) Inventors: Mark D. Hall, Austin, TX (US); Steven G. H. Anderson, Austin, TX (US); Mehul D. Shroff, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/514,449

(22) Filed: Oct. 15, 2014

(65) Prior Publication Data

US 2016/0109506 A1   Apr. 21, 2016

(51) Int. Cl.
*G01R 31/26* (2014.01)
*H01L 27/06* (2006.01)
*G01R 31/3181* (2006.01)

(52) U.S. Cl.
CPC ..... *G01R 31/2632* (2013.01); *G01R 31/2644* (2013.01); *H01L 27/0629* (2013.01); *G01R 31/31816* (2013.01)

(58) Field of Classification Search
CPC ............ G01R 31/2632; G01R 31/2644; H01L 21/822; H01L 27/0814; H01L 29/06; H01L 29/6609; H01L 31/118; H01L 31/1185

USPC .......................................................... 257/429
See application file for complete search history.

(56) References Cited

U.S. PATENT DOCUMENTS

| | | | |
|---|---|---|---|
| 7,804,138 B2 | 9/2010 | Morris | |
| 8,278,719 B2 | 10/2012 | Morris | |
| 8,451,028 B2 | 5/2013 | Chen et al. | |
| 8,497,195 B2 | 7/2013 | Morris | |
| 2003/0080381 A1* | 5/2003 | Parthasarathy | H01L 21/761 257/338 |
| 2008/0073725 A1 | 3/2008 | Morris | |
| 2012/0086432 A1* | 4/2012 | Noell | G01R 31/303 324/96 |

OTHER PUBLICATIONS

Morris, "Latchup in CMOS", 41st Annual IEEE International Reliability Physics Symposium Proceedings, Mar. 30-Apr. 4, 2003, pp. 76-84.

* cited by examiner

*Primary Examiner* — Shaun Campbell
*Assistant Examiner* — Aneta Cieslewicz

(57) ABSTRACT

A semiconductor device includes a substrate, first electronic circuitry formed on the substrate, a first diode buried in the substrate under the first electronic circuitry, and a first fault detection circuit coupled to the first diode to detect energetic particle strikes on the first electronic circuitry.

17 Claims, 3 Drawing Sheets

SEMICONDUCTOR DEVICE WITH UPSET EVENT DETECTION AND METHOD OF MAKING

BACKGROUND

1. Field

This disclosure relates generally to semiconductors, and more specifically, to upset events caused by energetic particles in semiconductors.

2. Related Art

As the demand for smaller devices continues, the devices that make up integrated circuits continue to shrink. As the size of the semiconductor devices decreases, the number of structures susceptible to errors caused by energetic particles similarly increases. This is generally most significant for volatile memories but other circuits can be impacted as well. Soft errors can occur, for example, when external energy, such as energy due to alpha particle bombardment, is imparted onto the circuit, causing bit values in volatile memory, logic registers, and other devices, to change to erroneous values. Latch-up can also be induced in circuits by energetic particles. Latch-up can be destructive or non-destructive. Whether the event is destructive or non-destructive, the event may be called an upset event.

Mitigation techniques can be employed to minimize the impact of an energetic particle strike. One technique is a voting arrangement which requires redundancy and the ability to perform the vote. Error correction is another approach which requires another type of redundancy and may still be inadequate, especially if the upset event is destructive. Another approach is simply to detect that an energetic particle that will typically cause an upset event has struck the circuit. This may be all that is desired due to the high cost of the space required to mitigate the impact. Further, detection of the upset event is likely to be needed even if there is a need to mitigate the impact of an upset event.

Accordingly there is a need to provide further improvement in obtaining upset event information.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a semiconductor device includes a buried layer of a first conductivity type within a substrate of a second conductivity type. The buried layer is under a circuit for which it is desirable to have upset event detection. Viewing the top surface, which is also a major surface of the semiconductor device, as being horizontal, the buried layer runs horizontally under the circuit. The buried layer is connected to a detection circuit through a vertical connection that extends from the buried layer to the top surface of the semiconductor device. The vertical connection is of the same conductivity type as the buried layer. The vertical connection may also be called a conductive contact. This is better understood by reference to the drawings and the following written description.

The substrate described herein can be any semiconductor material or combinations of materials, such as gallium arsenide, silicon germanium, silicon-on-insulator (SOI), silicon, monocrystalline silicon, the like, and combinations of the above.

Figure 1:
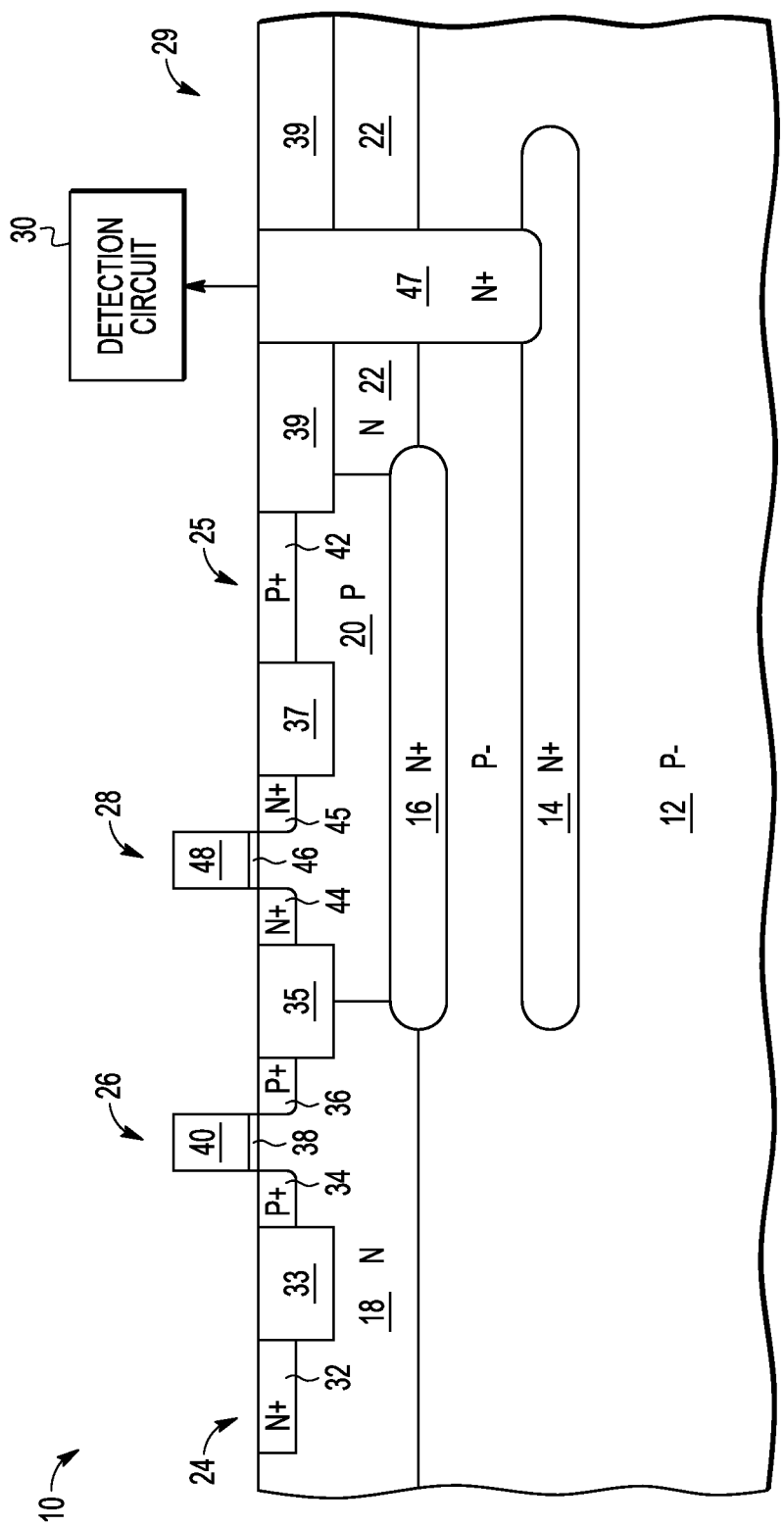
FIG. 1 is a combination cross section and block diagram of a semiconductor device with upset event detection.

Shown in FIG. 1 is a semiconductor device 10 with a substrate 12 having a background doping of P−, a buried layer 14 that is of doping N+, a buried layer 16 that is of doping N+, a well 18 of doping N, a well 20 of doping P, a well 22 of doping N, a well contact 24, a well contact 25, a P-type transistor 26, an N-type transistor 28, a connection region 29, and a detection circuit 30 which is shown as a block diagram. Well contact 24 includes a doped region 32 that is of doping N+ and in well 18. Transistor 26 includes a source/drain 34 that is of doping P+ and in well 18, a source/drain 36 that is of doping P+ and in well 18, and a gate dielectric 38 on the surface of substrate 12 between source/drains 34 and 36. An isolation region 33 is located between doped region 32 and source/drain 34. Transistor 28 includes a source/drain 44 that is of doping N+ and in well 20, a source/drain 45 that is of doping N+ and in well 20, and a gate dielectric 46 on the surface of substrate 12 between source/drains 44 and 45. Well contact 25 includes a doped region 42 that is of doping P+ and in well 20. An isolation region 35 is located between source/drain 36 and source/drain 44. An isolation region 37 is located between doped region 42 and source/drain 45. Connection region 29 has an isolation region 39 that is adjacent to doped region 42 and a vertical connection 47. Buried layer 16, which is below well 20, spans from the bottom of well 18 to the bottom of well 22 to isolate well 20 from the rest of semiconductor device 10 outside of well 20 and thereby covers a critical portion of transistor 28. Buried layer 14 is below and spaced from buried layer 16 and extends horizontally to vertical connection 47. Vertical connection 47 extends from the surface of substrate 12 through isolation region 39, well 22, and a portion of substrate 12 between buried layer 14 and well 22 and contacts buried layer 14. Vertical connection 47 is a conductive contact that runs vertically. As an example of possible dimensions, a middle of buried layer 16 may be about 1.5 microns below the top surface of substrate 12, and a middle of buried layer 14 may be about 2.5 microns below the top surface of substrate 12. The doping levels indicated by plus (+) and minus (−) are indicators of relative doping levels compared to an absence of an indicator. For example P+ means a higher concentration than P, and P− means a lower concentration than P. Transistor 26 is an example of electronic circuitry that is not being monitored for an upset event, whereas transistor 28 is an example of electronic circuitry that is being monitored for an upset event.

Figure 2:
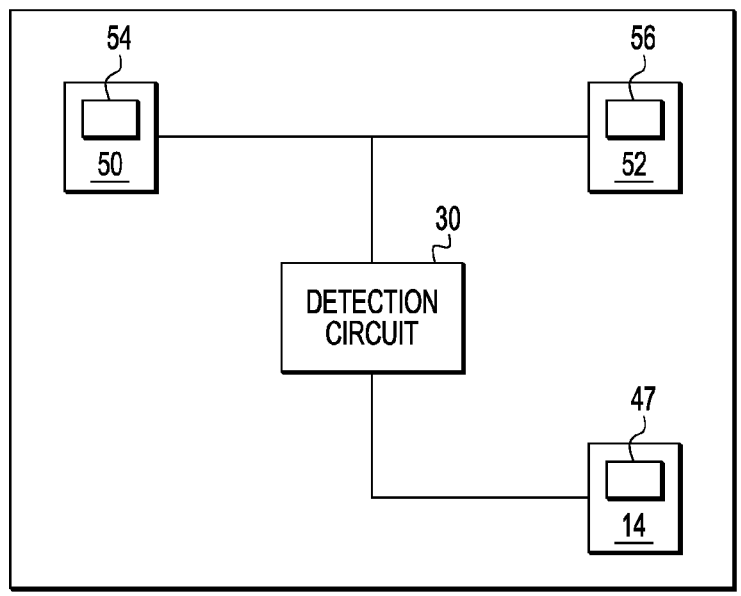
FIG. 2 is a top view of the semiconductor device of FIG. 1.

Shown in FIG. 2 is a top view of semiconductor device 10 showing detection circuit 30 coupled to buried layer 14 through vertical connection 47 and further showing a buried layer 50 connected to detection circuit 30 through a vertical connection 54 and a buried layer 52 connected to detection circuit 30 through a vertical connection 56. This shows that detection circuit 30 may be at least partially shared among multiple buried layers.

Figure 3:
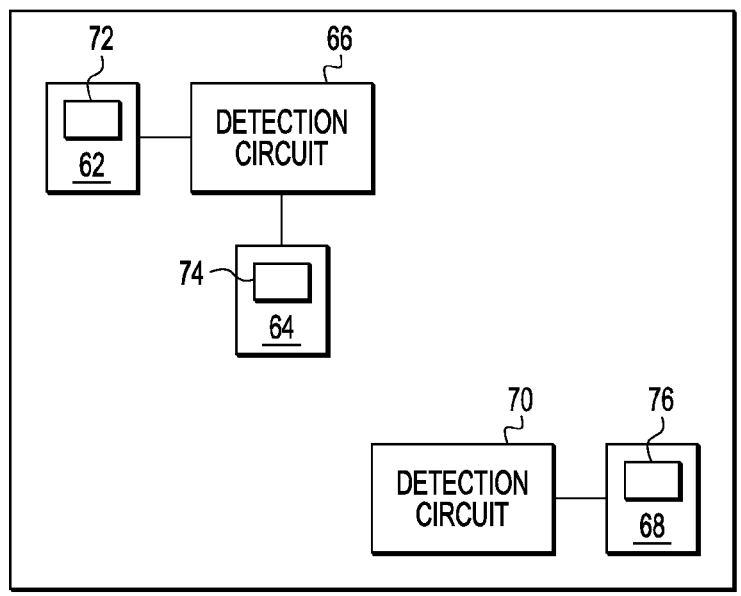
FIG. 3 is a top view of the semiconductor device with an alternative upset event detection.

Shown in FIG. 3 is a top view of semiconductor device 60 showing a detection circuit 66 coupled to a buried layer 62 through a vertical connection 72 and to a buried layer 64 through a vertical connection 74 and a detection circuit 70 connected to a buried layer 68 through a vertical connection 76. This shows how buried layers in close proximity may share a detection circuit and be separated as needed for reliable detection of an energetic particle in a particular location. Buried layers 62, 64, and 68 are surrounded by substrate of a different conductivity so can be considered diodes.

Figure 4:
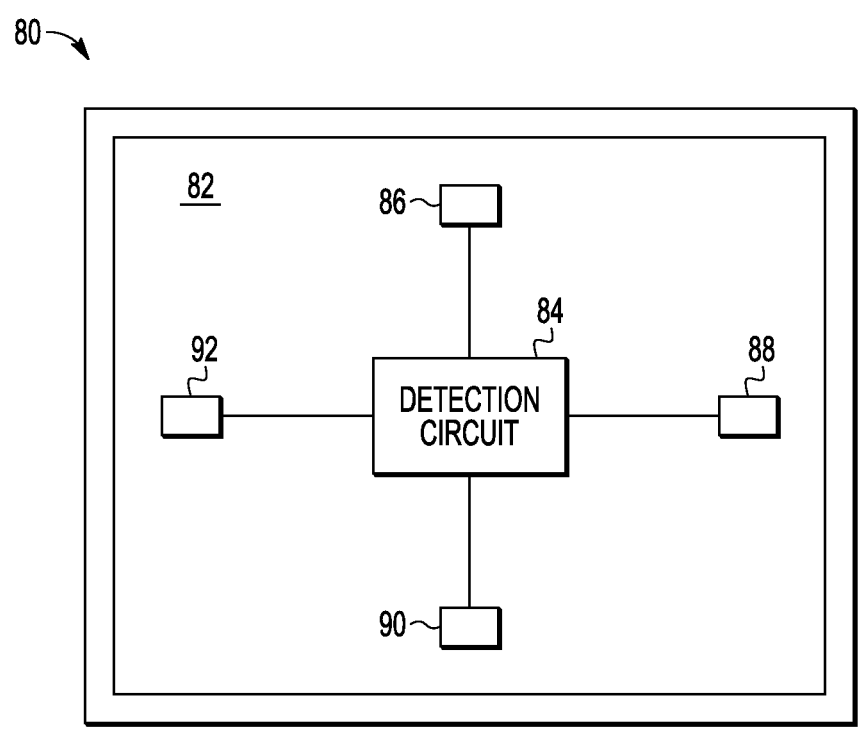
FIG. 4 is a top view of the semiconductor device with another alternative upset event detection.

Shown in FIG. 4 Shown in FIG. 3 is a top view of semiconductor device 80 showing a detection circuit 84 coupled to a buried layer 82, which is under most if not all of the circuitry of semiconductor device 80, through vertical connections 86, 88, 90, and 92. This is for the case where essentially all of semiconductor device 80 is being monitored for being hit by an energetic particle. Buried layer 82 is surrounded by substrate of a different conductivity so can be considered a diode.

In operation, referring to FIG. 1, an energetic particle may hit transistor 28. Transistor 28 may be chosen for detecting if an energetic particle has struck it because it may be the most critical transistor of a circuit that is performing a highly sensitive function. The impacting energetic particle continues through well 20, through buried layer 16, and through buried layer 14 causing the formation of electron-hole pairs along its path. Buried layer 14, within substrate 12, forms a diode with substrate 12. A depletion region is present along the border between buried layer 14 and substrate 12. Electrons created by the energetic particle drift toward the depletion region on the buried layer side and holes created by the energetic particle drift toward the depletion region on the substrate side. Thus, there is a change in one or more electrical characteristics of the diode such as capacitance, current, and voltage measurable at buried layer 14 in response to the impact of an energetic particle. Detection circuit 30 is thus designed to detect the magnitude of one or more of these changes in order to determine if an energetic particle has passed through transistor 28. When this has occurred it may be referenced as a fault. It may be advantageous to use a combination of techniques to perform the detection.

If current detection is used, the resistance of vertical connection 47 is particularly important. In addition, any distance between buried layer 14 and detection circuit 30 potentially introduces noise that can make detection more difficult. Thus a highly conductive path between buried layer 14 and detection circuit 30 is desirable. Vertical connection 47 could be a metal or polysilicon via but metal or polysilicon vias can be difficult to efficiently manufacture at the depth required to contact buried layer 14. One technique that may be use is a chained implant in which the energy of the implant is changed over the course of the implant to provide a more uniform doping and a higher overall doping level. Also, vertical connection 47 receives some protection from isolation region 39.

By now it should be appreciated that there has been provided a semiconductor device having a substrate having a first conductivity type. The semiconductor device further includes first electronic circuitry formed on a first major surface of the substrate. The semiconductor device further includes a first doped region in the substrate, wherein the first doped region has a second conductivity type opposite the first conductivity type, and the first doped region underlies the first electronic circuitry and is separated from the first major surface of the substrate by a first portion of the substrate. The semiconductor device further includes a first conductive contact formed between the first doped region and the first major surface of the substrate, the first conductive contact is in a first location of the first doped region. The semiconductor device further includes a fault detection module coupled to the first doped region through the first conductive contact. The semiconductor device may further include a second doped region with the second conductivity type in the substrate, wherein the second doped region is between the first electronic circuitry and the first doped region, and the first doped region and the second doped region are separated from one another by a second portion of the substrate. The semiconductor device may have a further characterization by which the first doped region and the first portion of the substrate form a diode and a fault is detected when an electrical characteristic of the diode changes when a particle of sufficient energy impacts the substrate. The semiconductor device may have a further characterization by which the second doped region covers a critical region of the first electronic circuitry. The semiconductor device may have a further characterization by which the first doped region spans a majority of area of the first major surface of the substrate. The semiconductor device may further include a second conductive contact formed between the first doped region and the first major surface of the substrate, the second conductive contact is coupled to the fault detection module, and the second conductive contact is in a second location of the first doped region. The semiconductor device may further include second electronic circuitry formed on the first major surface of the substrate, a second doped region in the substrate, wherein the second doped region has a second conductivity type opposite the first conductivity type, and the second doped region underlies the second electronic circuitry and is separated from the first major surface of the substrate by a second portion of the substrate, and a second conductive contact formed between the second doped region and the first major surface of the substrate, the second conductive contact is coupled to the fault detection module. The semiconductor device may further include second electronic circuitry formed on the first major surface of the substrate, a second doped region with the second conductivity type in the substrate, wherein the second doped region is under the second electronic circuitry and is separated from the first major of the substrate by a second portion of the substrate, a second conductive contact formed between the second doped region and the first major surface of the substrate, and a second fault detection module coupled to the second doped region through the second conductive contact.

Also described is a semiconductor device having a substrate. The semiconductor device also includes first electronic circuitry formed on the substrate. The semiconductor device also includes a first diode buried in the substrate under the first electronic circuitry. The semiconductor device also includes a first fault detection circuit coupled to the first diode to detect energetic particle strikes on the first electronic circuitry. The semiconductor device may further include a conductive contact formed between the first diode and a first major surface of the substrate, the conductive contact couples the first diode to the first fault detection circuit. The semiconductor device may further include a second diode buried in the substrate under the first electronic circuitry and coupled to the first fault detection circuit. The semiconductor device may further include second electronic circuitry formed on the substrate, and a second diode buried in the substrate under the second electronic circuitry and coupled to the first fault detection circuit. The semiconductor device may further include second electronic circuitry formed on the substrate, a second fault detection circuit, and a second diode buried in the substrate under the second electronic circuitry and coupled to the second fault detection circuit. The semiconductor device may have a further characterization by which the substrate has a first conductivity type and the first diode includes a portion of the substrate and a doped region with a second conductivity type that is opposite the first conductivity type. The semiconductor device may have a further characterization by which the portion of the substrate is between the doped region and the first electronic circuitry. The semiconductor device may have a further characterization by which the first fault detection circuit detects a change in an electrical characteristic of the first diode in response to the energetic particle strikes. The semiconductor device may have a further characterization by which an area of the first diode extends over a majority of area of the substrate.

Described also is a method including forming a first diode in a semiconductor substrate, wherein the first diode is buried in the semiconductor substrate. The method further includes coupling a first fault detection circuit to the first diode, wherein an electrical characteristic of the first diode has a change when a particle impacts the semiconductor substrate with a measurable level of energy, and the first fault detection circuit detects the change in the electrical characteristic. The method may further include forming a second diode in the semiconductor substrate, wherein the second diode is buried in the semiconductor substrate in a location that is different than a location of the first diode and coupling the second diode to one of a group consisting of: the first fault detection circuit and a second fault detection circuit. The method may further include forming electronic circuitry on the semiconductor substrate above the first diode.

Although the invention is described herein with reference to specific embodiments, various modifications and changes can be made without departing from the scope of the present invention as set forth in the claims below. For example, energetic particles can take a variety of forms of which alpha particles are one, but other particle types may have sufficient energy to cause an upset event as well. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device, comprising:
   a substrate having a first conductivity type;
   first electronic circuitry formed on a first major surface of the substrate;
   a first doped region in the substrate, wherein the first doped region has a second conductivity type opposite the first conductivity type, and the first doped region underlies the first electronic circuitry and is separated from the first major surface of the substrate by a first portion of the substrate;
   a first conductive contact formed between the first doped region and the first major surface of the substrate, the first conductive contact is in a first location of the first doped region;
   a fault detection module coupled to the first doped region through the first conductive contact; and
   a second doped region with the second conductivity type in the substrate, wherein the second doped region is between the first electronic circuitry and the first doped region, and the first doped region and the second doped region are separated from one another by a second portion of the substrate.

2. The semiconductor device of claim 1, wherein the first doped region and the first portion of the substrate form a diode and a fault is detected when an electrical characteristic of the diode changes when a particle of sufficient energy impacts the substrate.

3. The semiconductor device semiconductor of claim 1, wherein the second doped region covers a critical region of the first electronic circuitry.

4. The semiconductor device of claim 1, wherein the first doped region spans a majority of area of the first major surface of the substrate.

5. The semiconductor device of claim 4, further comprising:
   a second conductive contact formed between the first doped region and the first major surface of the substrate, the second conductive contact is coupled to the fault detection module, and the second conductive contact is in a second location of the first doped region.

6. The semiconductor device of claim 1, further comprising:
   second electronic circuitry formed on the first major surface of the substrate;
   a second doped region in the substrate, wherein the second doped region has a second conductivity type opposite the first conductivity type, and the second doped region underlies the second electronic circuitry and is separated from the first major surface of the substrate by a second portion of the substrate; and
   a second conductive contact formed between the second doped region and the first major surface of the substrate, the second conductive contact is coupled to the fault detection module.

7. The semiconductor device of claim 1, further comprising:
   second electronic circuitry formed on the first major surface of the substrate;
   a second doped region with the second conductivity type in the substrate, wherein the second doped region is under the second electronic circuitry and is separated from the first major surface of the substrate by a second portion of the substrate;
   a second conductive contact formed between the second doped region and the first major surface of the substrate; and a second fault detection module coupled to the second doped region through the second conductive contact.

8. A semiconductor device comprising:
a substrate;
first electronic circuitry formed on the substrate;
a first diode buried in the substrate under the first electronic circuitry; and
a first fault detection circuit coupled to the first diode to detect energetic particle strikes on the first electronic circuitry; and
a second diode buried in the substrate under the first electronic circuitry and coupled to the first fault detection circuit.

9. The semiconductor device of claim 8, further comprising:
a conductive contact formed between the first diode and a first major surface of the substrate, the conductive contact couples the first diode to the first fault detection circuit.

10. The semiconductor device of claim 8, further comprising:
second electronic circuitry formed on the substrate; and
a second diode buried in the substrate under the second electronic circuitry and coupled to the first fault detection circuit.

11. The semiconductor device of claim 8, further comprising:
second electronic circuitry formed on the substrate;
a second fault detection circuit;
a second diode buried in the substrate under the second electronic circuitry and coupled to the second fault detection circuit.

12. The semiconductor device of claim 8, wherein the substrate has a first conductivity type and the first diode includes a portion of the substrate and a doped region with a second conductivity type that is opposite the first conductivity type.

13. The semiconductor device of claim 12, wherein the portion of the substrate is between the doped region and the first electronic circuitry.

14. The device of claim 8, wherein the first fault detection circuit detects a change in an electrical characteristic of the first diode in response to the energetic particle strikes.

15. The device of claim 8, wherein an area of the first diode extends over a majority of area of the substrate.

16. A method comprising:
forming a first diode in a semiconductor substrate, wherein the first diode is buried in the semiconductor substrate;
coupling a first fault detection circuit to the first diode, wherein an electrical characteristic of the first diode has a change when a particle impacts the semiconductor substrate with a measurable level of energy, and the first fault detection circuit detects the change in the electrical characteristic;
forming a second diode in the semiconductor substrate, wherein the second diode is buried in the semiconductor substrate in a location that is different than a location of the first diode; and
coupling the second diode to one of a group consisting of: the first fault detection circuit and a second fault detection circuit.

17. The method of claim 16, further comprising:
forming electronic circuitry on the semiconductor substrate above the first diode.

* * * * *